(12) United States Patent
Summerfelt et al.

(10) Patent No.: US 11,387,271 B2
(45) Date of Patent: Jul. 12, 2022

(54) OPTICAL SENSOR WITH TRENCH ETCHED THROUGH DIELECTRIC OVER SILICON

(71) Applicant: Texas Instruments Incorporated, Dallas, TX (US)

(72) Inventors: Scott Robert Summerfelt, Garland, TX (US); Hassan Omar Ali, Murphy, TX (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 100 days.

(21) Appl. No.: 16/716,652

(22) Filed: Dec. 17, 2019

(65) Prior Publication Data

US 2021/0183915 A1 Jun. 17, 2021

(51) Int. Cl.
*H01L 27/146* (2006.01)

(52) U.S. Cl.
CPC .... *H01L 27/1462* (2013.01); *H01L 27/14618* (2013.01); *H01L 27/14627* (2013.01); *H01L 27/14629* (2013.01); *H01L 27/14636* (2013.01); *H01L 27/14685* (2013.01)

(58) Field of Classification Search
CPC .......... H01L 27/1462; H01L 27/14618; H01L 27/14685; H01L 27/14629; H01L 27/14636; H01L 27/14627; H01L 27/14632; H01L 27/14687; H01L 31/00
See application file for complete search history.

(56) References Cited

U.S. PATENT DOCUMENTS

| 6,023,102 | A | 2/2000 | Nguyen et al. | |
|---|---|---|---|---|
| 8,502,389 | B2* | 8/2013 | Ho | H01L 21/76898 257/774 |
| 2010/0244173 | A1* | 9/2010 | Wang | H01L 27/14685 257/435 |
| 2013/0181317 | A1* | 7/2013 | Wakiyama | H01L 21/76898 257/459 |
| 2016/0056196 | A1* | 2/2016 | Li | H01L 27/14634 257/432 |
| 2017/0271594 | A1 | 9/2017 | Barth | |
| 2019/0051559 | A1 | 2/2019 | Tsai et al. | |

OTHER PUBLICATIONS

Search Report for PCT Patent Application No. PCT/US2020/065471, date of mailing of the international search report dated Apr. 1, 2021, 1 page.
Ingrid Jonak-Auer, "arris' Technology Concepts on Monolithic Integrated Photosensors", ICHEP (International Conference on High Energy Physics), Jul. 4-11, 2018, Seoul, pp. 1-27.

* cited by examiner

*Primary Examiner* — Jonathan Han
(74) *Attorney, Agent, or Firm* — Michael A. Davis, Jr.; Charles A. Brill; Frank D. Cimino

(57) ABSTRACT

In described examples an integrated circuit (IC) has multiple layers of dielectric material overlying at least a portion of a surface of a substrate. A trench is etched through the layers of dielectric material to expose a portion the substrate to form a trench floor, the trench being surrounded by a trench wall formed by the layers of dielectric material. A metal perimeter band surrounds the trench adjacent the trench wall, the perimeter band being embedded in one of the layers of the dielectric material.

16 Claims, 9 Drawing Sheets

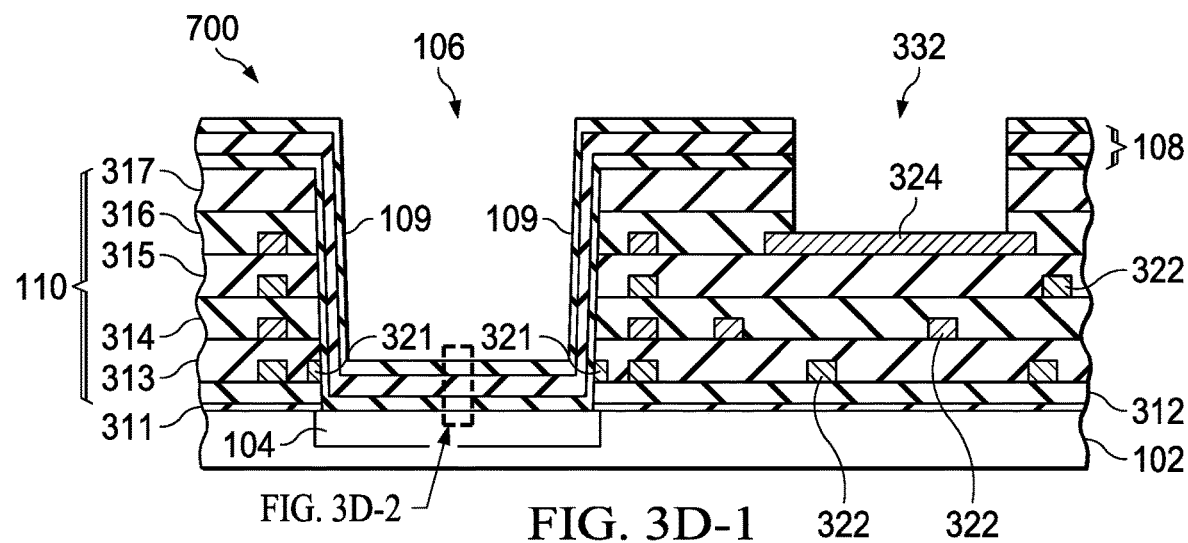
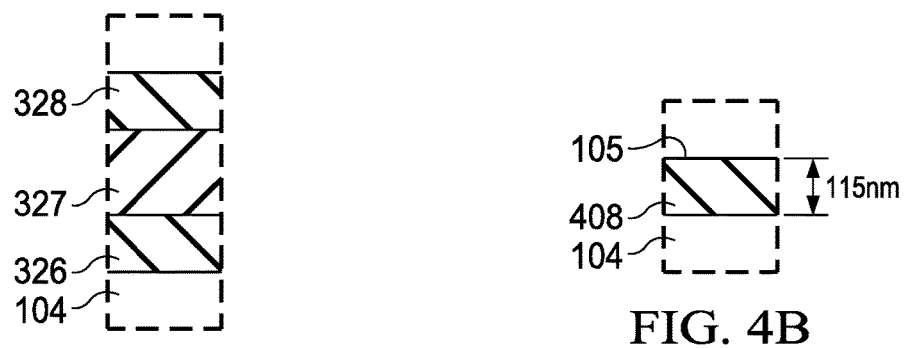
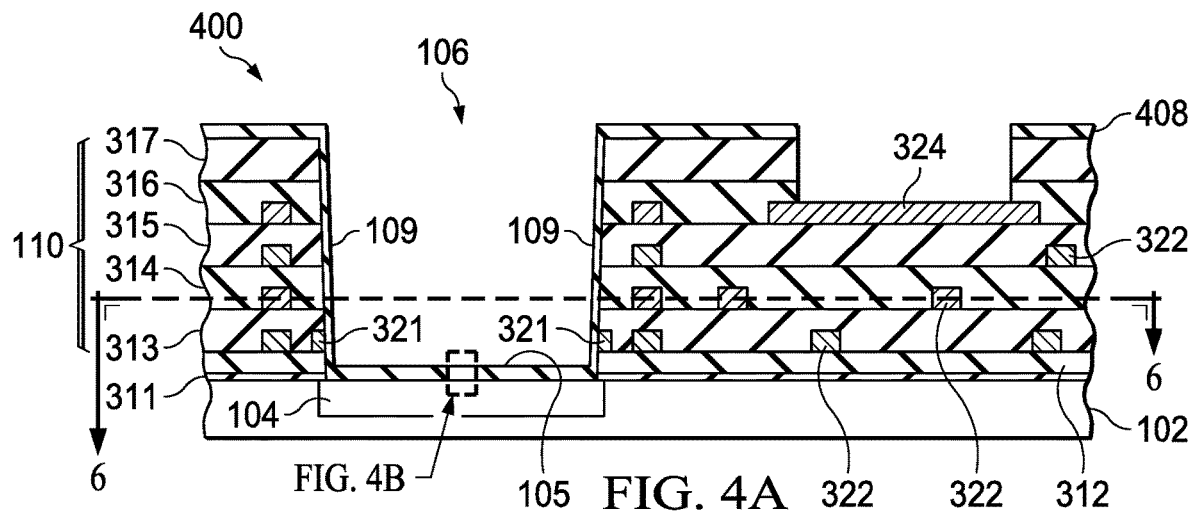

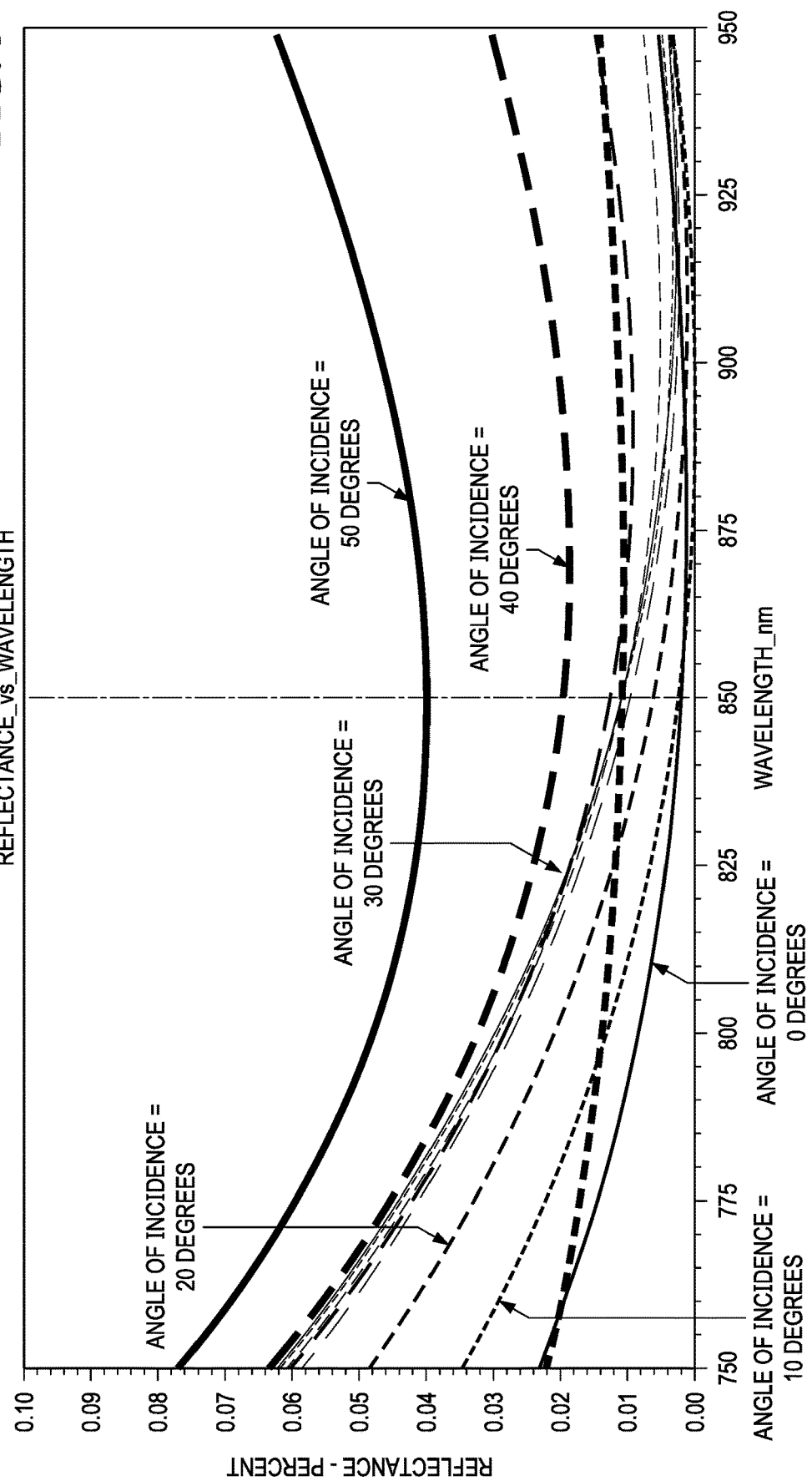

OPTICAL SENSOR WITH TRENCH ETCHED THROUGH DIELECTRIC OVER SILICON

TECHNICAL FIELD

This relates to etching a trench through multiple layers of dielectric over silicon for an optical sensor.

BACKGROUND

An optical sensor is a device that converts light rays into electronic signals. It detects the physical quantity of incident light and translates it into a form that can be read by a signal processing system. An optical sensor is generally part of a larger system that integrates a source of light, a measuring device and the optical sensor. One of the features of an optical sensor is its ability to measure the changes from one or more light beams. This change is most often based around alterations to the intensity of the light. Optical sensors can work either on a single point method or through a distribution of points along a series of sensors. Optical sensors may be based on visible, infrared (IR) or ultraviolet (UV)) radiation.

Optical sensors are used in numerous research and commercial applications such as for quality and process control, medical technologies, metrology, imaging, remote sensing, etc. Autonomous vehicles make use of optical sensors for navigation and collision avoidance.

A common type of photo sensor uses silicon-based photo diodes. Photodiodes convert an amount of incident light into an output electric current.

SUMMARY

In described examples, an integrated circuit (IC) has multiple layers of dielectric material overlying at least a portion of a surface of a silicon substrate. A trench is etched through the layers of dielectric material to expose a portion of the substrate to form a trench floor, the trench being surrounded by a trench wall formed by the layers of dielectric material. A metal perimeter band that is a portion of a metal plate etch stop surrounds the trench adjacent the trench wall, the perimeter band being embedded in one of the layers of the dielectric material.

BRIEF DESCRIPTION OF THE DRAWINGS

FIGS. 3A-3D-1, 3D-2 are cross-sectional views illustrating fabrication of a trench within an IC.

FIGS. 4A, 4B are cross sectional views of a portion of an IC illustrating an optical sensor with a single-layer anti-reflection coating (ARC).

FIG. 5 is a plot of reflectance vs wavelength for a single layer ARC for different angles of incidence and light polarizations.

DETAILED DESCRIPTION

Figure 1:
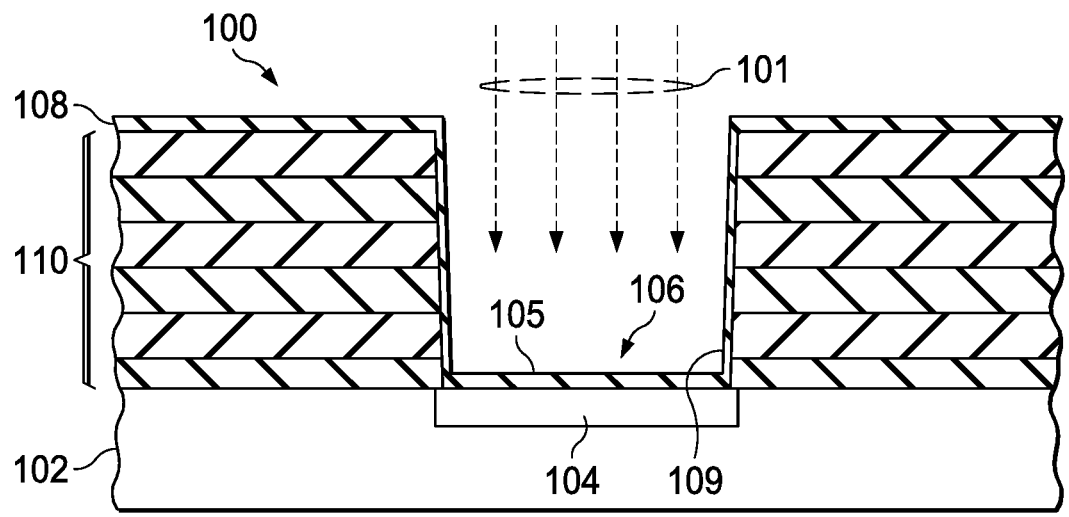
FIG. 1 is a cross-sectional view of a portion of an integrated circuit (IC) that includes an optical sensor.

In the drawings, like elements are denoted by like reference numerals for consistency.

Optical sensors (visible, infrared (IR) and ultraviolet (UV)) using silicon photodiode (Si) sensors need to get the incident light to the silicon-based sensor so that the photodiodes can convert an amount of incident light into an output electric current. Dielectrics between the silicon photodiode and the environment can either reflect or absorb incident light thereby reducing the light to the sensor. A typical example complementary metal oxide semiconductor (CMOS) dielectric stack with multiple metallization layers for interconnects creates uncontrolled light reflections due to the surface undulations and multiple layer-layer interfaces. This can be reduced slightly but not eliminated by adding an anti-reflection coating (ARC) on top of the dielectric layers. To enable more light to fall on to the sensor, the dielectrics need to be substantially removed so that the ARC can be placed immediately above the photodiodes.

FIG. 1 is a cross-sectional view of a portion of an integrated circuit (IC) 100 that includes a photodiode optical sensor 104. IC 100 is an example CMOS IC that includes other circuitry (not shown) that is fabricated on silicon (Si) substrate 102 using known or later developed CMOS fabrication techniques. Multiple dielectric and metal layers 110 are fabricated on top of substrate 102. The various metal layers are patterned using known or later developed techniques to form a multilayer metal interconnect network to interconnect photodiode 104 and other circuitry on CMOS IC 100.

In this example, photodiode 104 is a PIN structure. A PIN structure includes a wide, undoped intrinsic semiconductor region between a p-type semiconductor and an n-type semiconductor region. The p-type and n-type regions are heavily doped because they are used for ohmic contacts. In other examples, different types of photodiodes may be used, such as a traditional p-n junction diode or an avalanche photodiode. When a photon of sufficient energy strikes the diode, it creates an electron-hole pair. If the absorption occurs in the junction's depletion region, or within one diffusion length away from it, these carriers are swept from the junction by the electric field of the depletion region formed by a bias voltage applied to the diode. Thus, holes move toward the anode, and electrons move toward the cathode, and a photocurrent is produced. The total current through the photodiode is the sum of the dark current (current that is generated in the absence of light) and the photocurrent, therefore the dark current should be minimized to maximize the sensitivity of the device. For a given spectral distribution, the photocurrent is approximately linearly proportional to the irradiance.

Trench 106 is etched through the dielectric layers 110 to allow incident light, such as example incident light 101, to fall directly on photodiode 104. In this manner, uncontrolled reflections from the various dielectric layers is eliminated. An antireflective coating (ARC) layer 108 is deposited on the surface of IC 100 and provides an ARC on the bottom 105 and sides 109 of trench 106 to control reflections within trench 106.

A problem with etching trench 106 through thick dielectric stack 110 that has multiple metal layers is that a typical passivation overcoat (PO) layer or interconnect-via plasma etch is not selective to the silicon in substrate 102 and photodiode 104. Due to the variability in the etch rate and dielectric thickness, a large and extremely variable over-etch of the silicon surface of photodiode 104 would likely occur. A large variation in the amount of silicon removed is undesirable for the sensor. An etching process described in more detail hereinbelow produces a smooth flat bottom 105 for trench 106.

Figure 2:
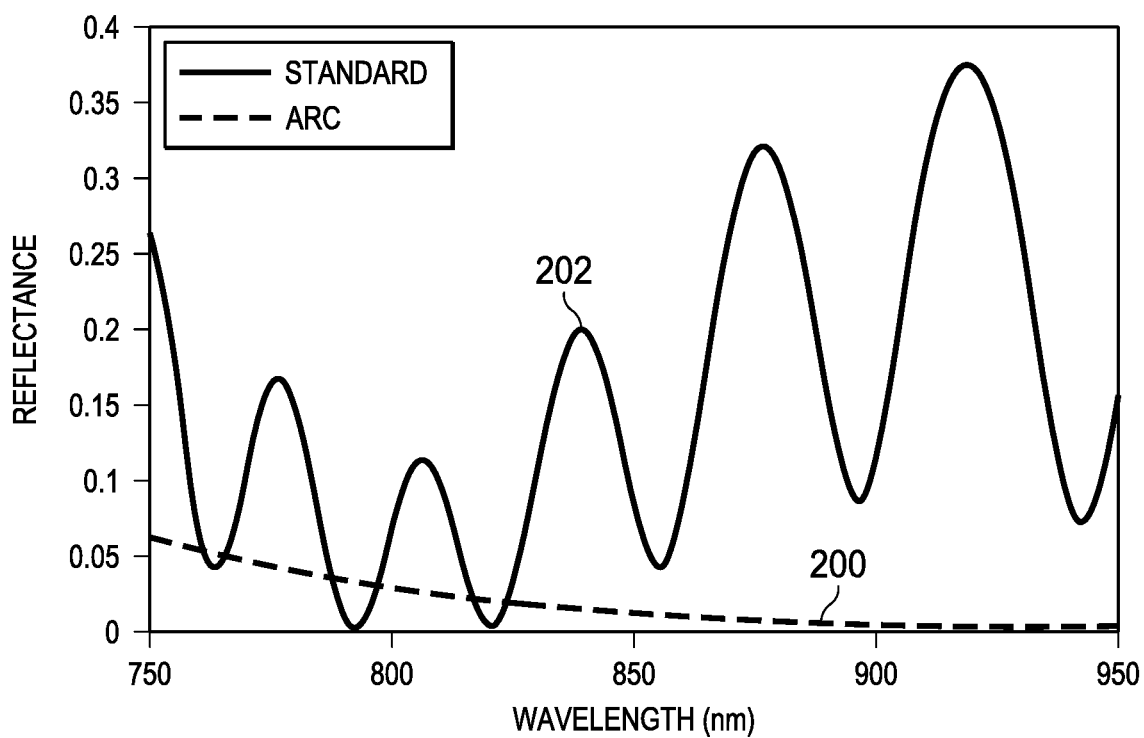
FIG. 2 is a plot illustrating operation of different optical sensors.

FIG. 2 is a plot of reflectance (%) vs. wavelength (nm) illustrating operation of different optical sensors. Plot line 200 illustrates the operation of optical sensor 104 in FIG. 1 in which trench bottom 105 (FIG. 1) is smooth and flat and covered with ARC 108 (FIG. 1). An essentially linear response is produced in which reflectance can be controlled to near 0% at some wavelengths of interest. A uniform low reflectivity across a range of wavelengths contributes to a similar uniform responsivity by optical sensor 104.

Plot line 202 illustrates the operation of an optical sensor in which a conventional process is used with a thick layer stack of dielectrics. In this case, reflectance varies widely across a range of wavelengths which will cause a similar undesirable non-linear responsivity in the operation of the optical sensor across the range of wavelengths or over process tolerances for the thickness of various layers.

FIGS. 3A-3D-1 are cross-sectional views of a portion of IC 100 illustrating fabrication of trench 106 within IC 100. A portion of substrate 102 is illustrated with photodiode 104 formed in the substrate using known or later developed fabrication techniques. Other circuitry (not shown) is also fabricated on substrate 102 using known or later developed CMOS fabrication techniques.

Figure 3A:
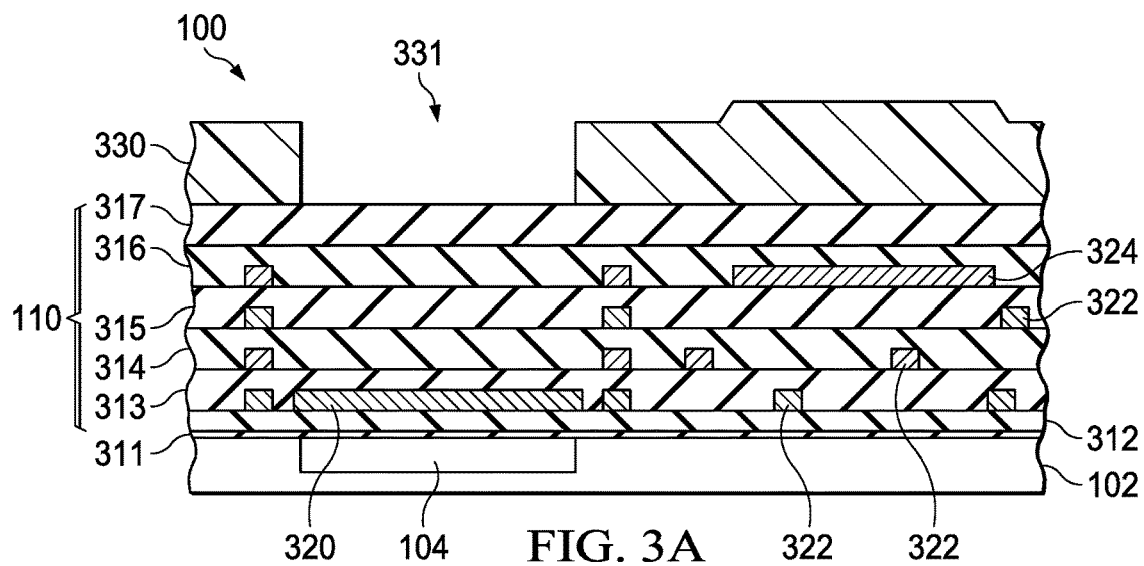

FIG. 3A is a cross-sectional view of a portion of IC 100 after all front end of line (FEOL) processing has been performed to fabricate photodiode 104 and other CMOS circuitry (not shown) on silicon substrate 102 using known or later developed CMOS fabrication techniques. FEOL is the first portion of IC fabrication where the individual devices (transistors, capacitors, resistors, etc.) are patterned in the semiconductor. FEOL generally covers everything up to, but not including, the deposition of metal interconnect layers. Deposition of metal layers and intervening dielectric layers and vias is performed during the back end of line (BEOL) processing.

BEOL processing has formed thin silicon nitride (SiN) passivation layer 311 that provides a dielectric layer over the active CMOS circuitry. This is followed by dielectric layer 312 and then layers of metal that are patterned and etched to form circuitry interconnects such as 322 and insulated by dielectric layers 313, 314, 315, 316. A passivation overcoat (PO) layer 317 then applied. Thus, four metal interconnect layers are illustrated in this example. Another example may include fewer or more metal interconnect layers. In this example, the dielectric layers 311-316 are silicon dioxide (SiO2), but in other examples other types of known or later developed dielectric layers may be fabricated. In this example, the metal layers are aluminum (Al). The SiN layer 311 is approximately 50 nm or less, each thick SiO2 layer 312-316 is approximately 4 μm to 8 μm. Typically a variation of +/−10% to +/−20% occurs in such a standard Al metal dielectric stack.

A metal plate etch-stop 320 is patterned in the first metal/dielectric layer 313 and covers the extent of pending trench 106 (FIG. 1). A photoresist layer 330 is applied and patterned to form an opening 331 that defines the extent of pending trench 106 using known or later developed photolithography processing techniques.

Figure 3B:
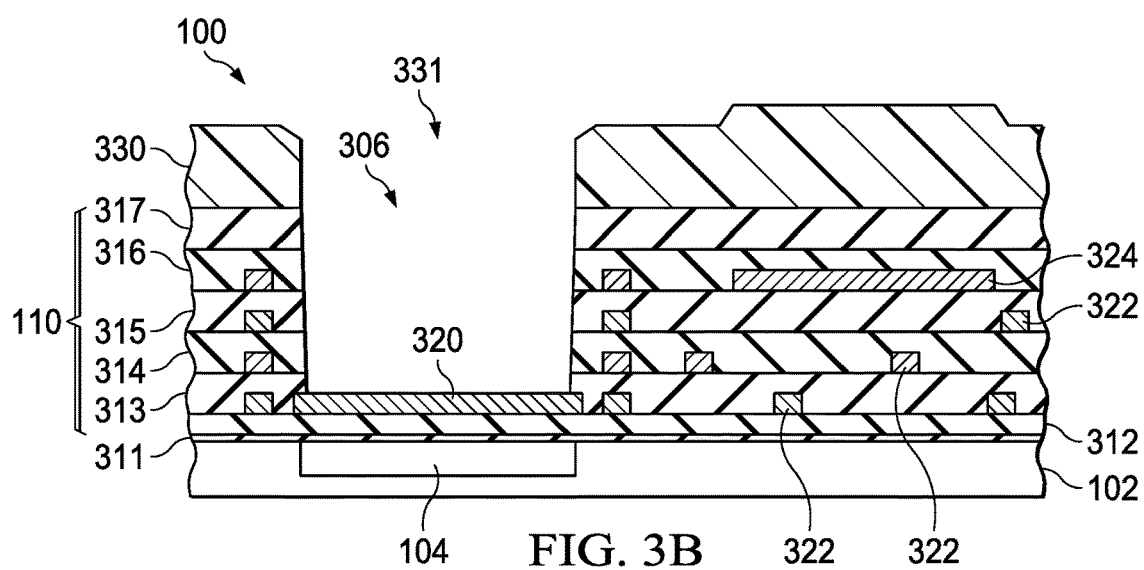

In FIG. 3B a plasma etch has been performed through opening 331 that etches through PO 317 and SiO2 layers 313-316 and stops on metal plate 320 to form a partial trench 306. The plasma etch process is selective to Al metal layer 320 and stops smoothly on the top surface of Al etch-stop feature 320.

Figure 3C:
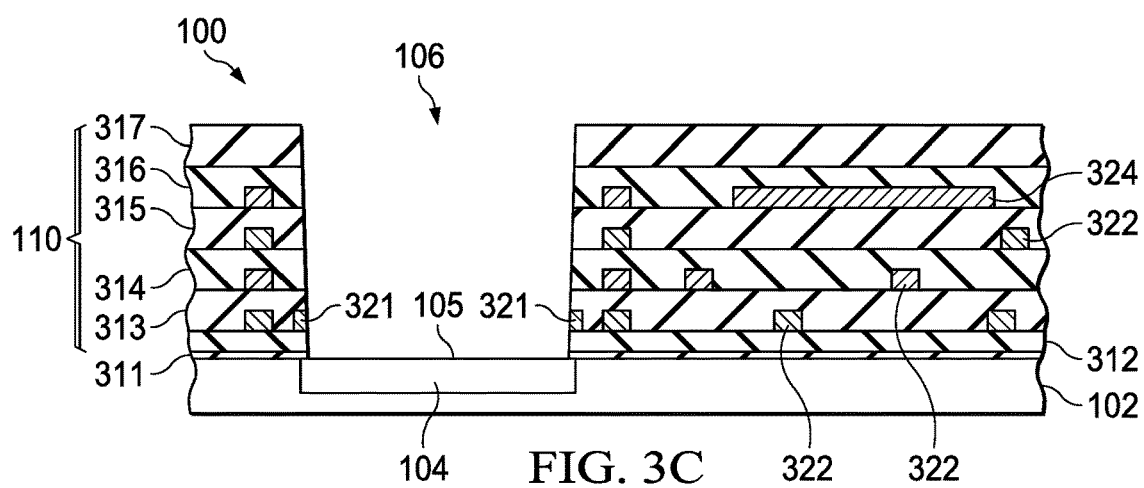

In FIG. 3C a wet etch is performed through Al feature 320 that stops on SiO2 layer 312. Al metal plate 320 is intentionally larger than the extent of trench 106 so that a metal perimeter band 321 remains surrounding the trench adjacent the trench wall, the metal perimeter band being embedded in layer 313 of the dielectric material. A third etch is performed through SiO2 layer 312 that stops on SiN layer 311. A fourth timed etch is then performed to etch through SiN layer 311 and only minimally etch the top Si surface of photodiode 104. In this manner, a smooth flat surface is formed on the top surface of photodiode 104 to form the smooth bottom 105 of trench 106. Photoresist layer 330 (see FIG. 3B) is then removed.

In FIG. 3D-1 a multilayer anti-reflective coating 108 is deposited over the surface of CMOS IC 100 in a manner that it evenly coats sides 109 and bottom 105 of trench 106. In this example, ARC 108 includes a layer of SiN 326, a layer of SiO2 327, and top layer of silicon-oxynitride (SiON) as illustrated in FIG. 3D-2.

A photoresist is then applied and patterned (not shown) followed by etch to expose contact pads on IC 100, such as contact pad 324. In another example the SiON PO 317 may be omitted and the dielectric stack combined with the ARC 317. This reduces the thickness of the PO that needs to be removed from the metal pads 324.

A plasma etch process can be used for the removal of the majority of the oxide above and below metal etch stop 320. The plasma process is easier to perform than a wet etch process and provides the taper on the sides of the trench. This approach works with both Al and copper (Cu) metallization. Cu metallization might require a wet etch process in place of a plasma etch to remove the Cu. Al might also be wet etched but may result in undercut of Al on the sides of the trench.

IC 100 is fabricated as one of many identical dies on a large semiconductor wafer, tested, separated into separate die, and then packaged using known or later developed CMOS fabrication techniques. CMOS die 100 is encapsulated by a mold compound using known or later developed packaging techniques. In examples, an opening or an optically conductive path is provided in the finished package to allow incident light to enter the package. In this example, the packaged IC is a quad flat no-leads package. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of printed circuit boards (PCBs) without through-holes. Flat no-lead is a near chip scale package plastic encapsulated package made with a planar copper leadframe substrate. Perimeter lands on the package bottom provide electrical connections to the PCB. Other examples may be packaged using other known or later developed packaging technologies, such as a quad-flat package, a ball grid array, etc.

In this manner, a trench 106 is fabricated above photodiode 104 that has a smooth planar floor 105 which allows a smooth ARC 108 to be formed on the bottom of the trench above the photodiode 104. The smooth, flat ARC contributes to a uniform responsivity by photodiode 104 across a range of incident light wavelengths.

FIG. 4A, 4B is a cross sectional view of a portion of IC 400 illustrating an optical sensor 104 with a single-layer anti-reflective coating 408. In described examples, photosensors use an ARC that is one of more layers where at least one layer is SiN, SiON or aluminum oxide (AlOx). This layer provides protection of the Si and SiO2 from metal contamination (such as Cu, Na, K, Ag, Au, Fe, . . . ) that can degrade the Si or metal wiring.

Narrow wavelength sensors can use a simple ARC. For example, near-IR sensors can use one or more ARC layers. An example optimized ARC is just a single preferential SiN layer 408 of approximately 115 nm for IR wavelength near 850 nm, as illustrated in FIG. 4B.

FIG. 5 is a plot of reflectance (%) vs wavelength (nm) for a single layer ARC, such as ARC layer 408 shown in FIG. 4 for various angles of incidence in a range of 0-50 degrees and for both s- and p-polarizations. The variation in reflectance over a range of incidence of 0-50 degrees and for both polarizations is less than 4% at 850 nm wavelength. Further reflectance performance optimization over a particular wavelength range could be achieved with different ARC layer thicknesses values and material properties.

Figure 6:
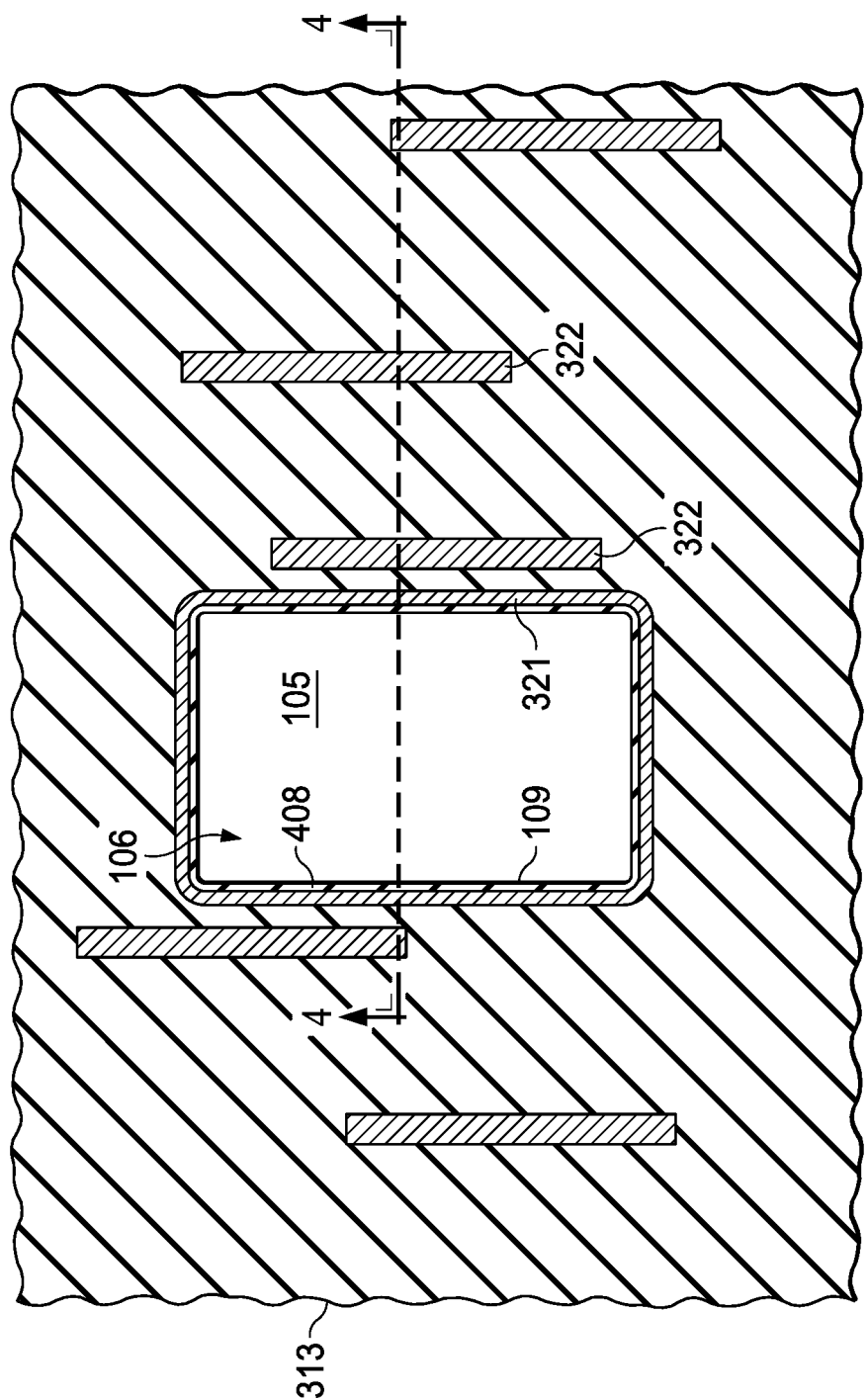
FIG. 6 is a top cross-sectional view of a portion of the IC of FIG. 4.

FIG. 6 is a top cross-sectional view of a portion of IC 400 of FIG. 4 illustrating trench 106. A top cross-sectional view of IC 100 is similar. This cross-sectional view illustrates dielectric layer 313 and various metal interconnects, such as metal lines 322.

In this example, trench 106 has a generally rectangular shape. However, in other examples various trench shapes may be used, such as circular, oval, or more complex shapes for special purposes. Trench wall 109 is covered with the ARC 408, as described in more detail with reference to FIG. 4.

Metal perimeter band 321 is what is left over after metal plate etch-stop 320 (FIG. 3B) is etched through and remains embedded in dielectric layer 313 after completion of the etch process illustrated in FIG. 3C. It surrounds trench 106 and is adjacent the wall 109 of trench 106. In various examples the size of metal band 321 may be minimal, just large enough to survive the etch process. In other examples, metal band 321 may extend further into dielectric layer 313 and may serve other functions within IC 400, such as a ground plane or voltage plane.

FIGS. 7A-7D are cross-sectional views of a portion of another example IC 700 illustrating formation of a trench 706 using multiple etch-stops. IC 700 is similar to IC 100 (FIG. 1) and IC 400 (FIG. 4) with the addition of a second metal plate etch-stop 720 in dielectric layer 315.

Figure 7A:
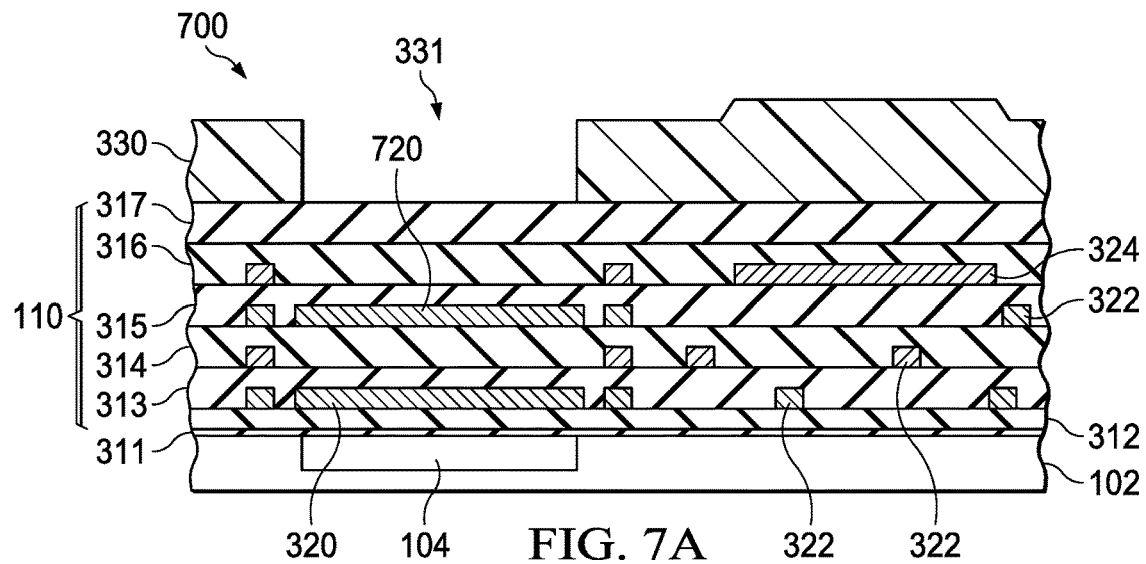
FIGS. 7A-7D are cross-sectional views of a portion of another example IC illustrating formation of a trench using multiple etch-stops.

FIG. 7A is a cross-sectional view of a portion of IC 700 after all FEOL processing has been performed to fabricate photodiode 104 and other CMOS circuitry (not shown) on silicon substrate 102 using known or later developed CMOS fabrication techniques.

BEOL processing has formed thin silicon nitride (SiN) passivation layer 311 that provides a dielectric layer over the active CMOS circuitry. This is followed by dielectric layer 312 and then layers of metal that are patterned and etched to form circuitry interconnects such as 322 and insulated by dielectric layers 313, 314, 315, 316. A passivation overcoat (PO) layer 317 then applied. Thus, four metal interconnect layers are illustrated in this example. Another example may include fewer or more metal interconnect layers. In this example, the dielectric layers 311-316 are SiO2, but in other examples other types of known or later developed dielectric layers may be fabricated. In this example, the metal layers are aluminum (Al). The SiN layer 311 is approximately 50 nm, each thick SiO2 layer 312-316 is approximately 4 µm to 8 µm. Typically a variation of +/−10% to +/−20% occurs in such a standard Al metal dielectric stack.

A metal plate etch-stop 320 is patterned in the first metal/dielectric layer 313 and covers the extent of pending trench 706. A second metal plate etch-stop 720 is patterned in metal/dielectric layer 315 and also covers the extent of pending trench 706. A photoresist layer 330 is applied and patterned to form an opening 331 that defines the extent of pending trench 706 using known or later developed photolithography processing techniques.

Figure 7B:
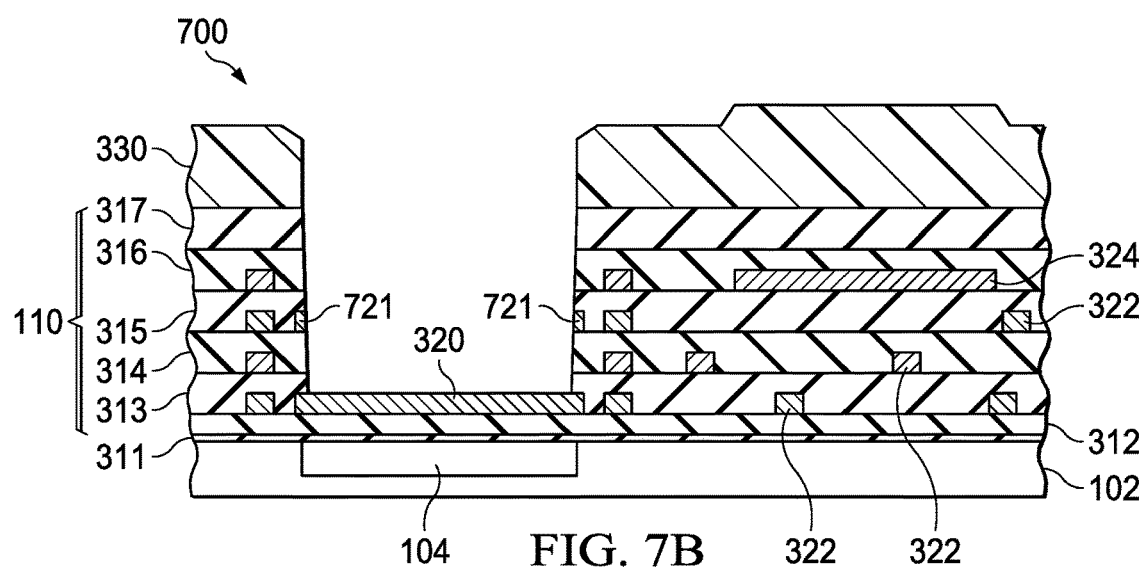
Figure 7C:
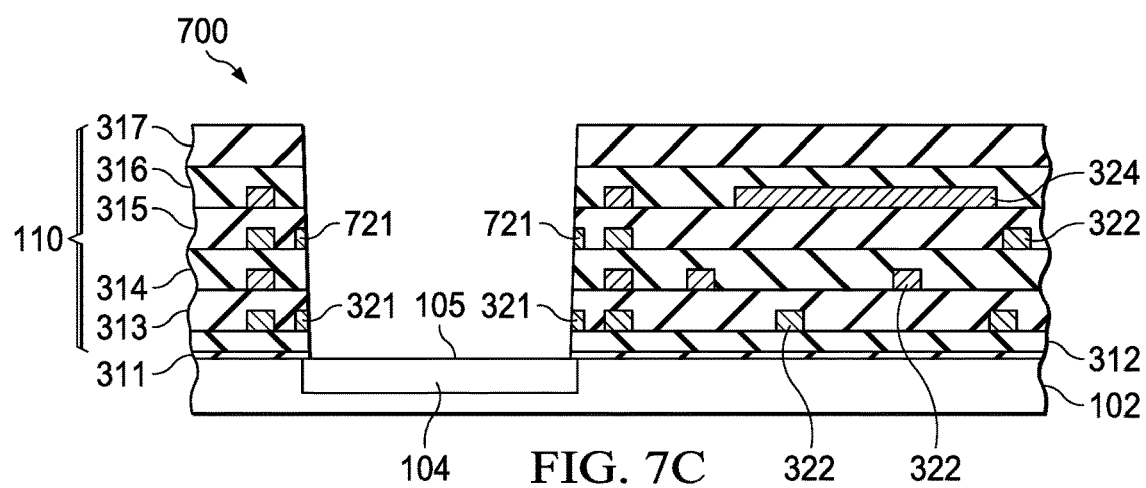
Figure 7D:
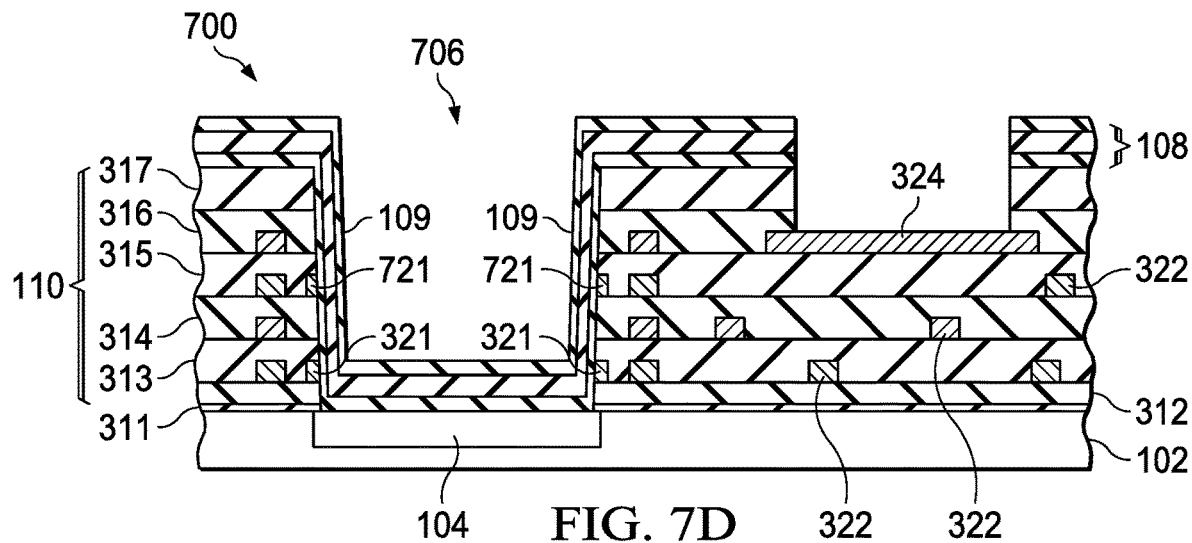

In FIG. 7B a plasma etch has been performed through opening 331 that etches through PO 317 and SiO2 layers 315 and 316 and stops on metal plate 720 to form a partial trench. The plasma etch process is selective to Al metal layer 720 and stops smoothly on the top surface of Al etch stop feature 720. A wet etch is then performed through Al feature 720 that stops on SiO2 layer 314. Al metal plate 720 is intentionally larger than the extent of trench 706 so that a metal perimeter band 721 remains surrounding the trench adjacent the trench wall, the metal perimeter band being embedded in layer 315 of the dielectric material. A second plasma etch is performed through opening 331 that etches SiO2 layers 313, 314 and stops on metal plate 320 to deepen the partial trench.

In FIG. 6C a second wet etch is performed through Al feature 320 that stops on SiO2 layer 312. Al metal plate 320 is intentionally larger than the extent of trench 706 so that a metal perimeter band 321 remains surrounding the trench adjacent the trench wall, the metal perimeter band being embedded in layer 313 of the dielectric material. Another plasma etch is performed through SiO2 layer 312 that stops on SiN layer 311. A timed etch is then performed to etch through SiN layer 311 and only minimally etch the top Si surface of photodiode 104. In this manner, a smooth flat surface is form on the top surface of photodiode 104 to form the bottom 105 of trench 706. Photoresist layer 330 (see FIG. 6B) is then removed.

In FIG. 6D a multilayer anti-reflective coating 108 is deposited over the surface of CMOS IC 700 in a manner that it evenly coats sides 109 and bottom 105 of trench 706. In this example, ARC 108 includes a layer of SiN 326, a layer of SiO2 327, and top layer of silicon-oxynitride (SiON), as shown in FIG. 3D-2. In other examples, different types of ARC may be used, such as a single layer ARC 408 as described with regard to FIG. 4.

A photoresist is then applied and patterned (not shown) followed by another plasma etch to expose contact pads, such as contact pad 324.

A plasma etch process can be used for the removal of the majority of the oxide above and below metal etch stops 320, 720. The plasma process is easier to perform than a wet etch process and provides the taper on the sides of the trench. This approach works with both Al and copper (Cu) metallization. Cu metallization might require a wet etch process in place of a plasma etch to remove the Cu. Al might also be wet etched but may result in undercut of Al on the sides of the trench.

IC 700 is fabricated as one of many identical dies on a large semiconductor wafer, tested, separated into separate die, and then packaged using known or later developed CMOS fabrication and packaging techniques.

In this manner, a trench 706 is fabricated above photodiode 104 that has a smooth planar floor 105 which allows a smooth ARC 108 to be formed on the bottom of the trench above the photodiode 104. The smooth, flat ARC contributes to a uniform responsivity by photodiode 104 across a range of incident light wavelengths.

Figure 8:
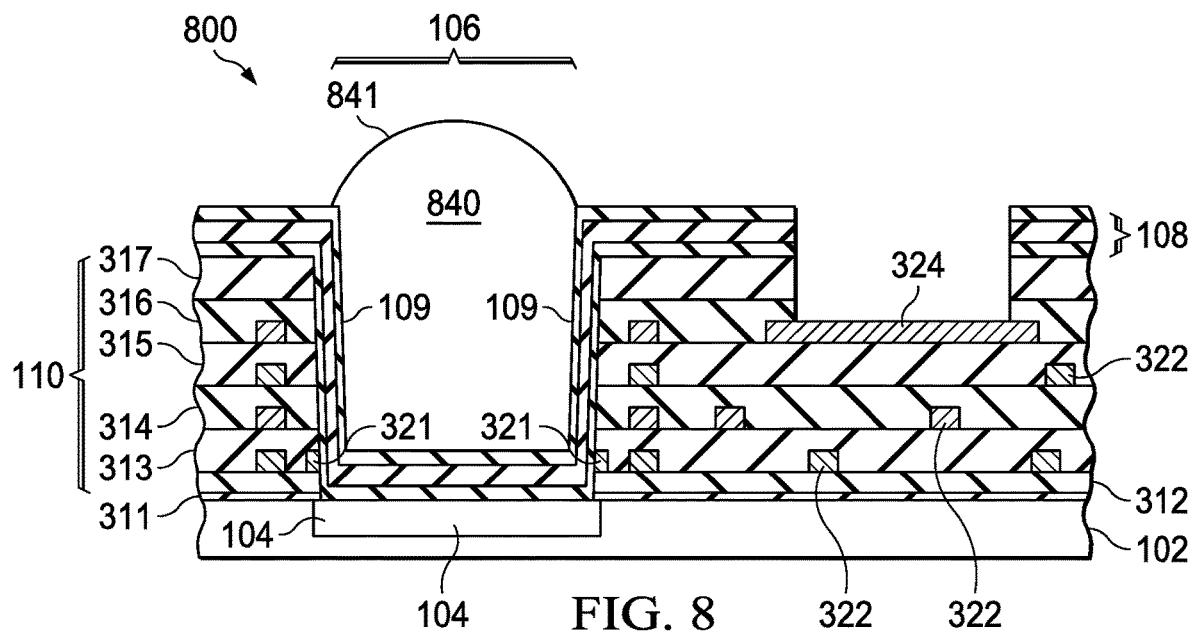
FIG. 8 is a cross-sectional view of a portion of another example IC with a trench filled with a printed filter.

FIG. 8 is a cross-sectional view of a portion of another example IC 800 having a trench 106 filled with a filter 840. The presence of trench 106 over photosensor 104 advantageously provides a way to install different light filters 840 using polymer materials. Filter 840 can be used for wavelength selection such as red, green, blue, violet, human light response, etc. by selecting an appropriate filter material.

In this example, polymer filter material 840 is installed only within the region of trench 106 using an additive manufacturing process, such as by three-dimensional (3D) printing using a printer similar to an ink jet printer. Additive manufacturing has enabled the deposition of patterned materials in a rapid and cost-efficient manner. Additive manufacturing processes are now being used in several areas. The International Association for Testing Materials (ASTM) has now promulgated ASTM F7292-12a "Standard Terminology for Additive Manufacturing Technologies" 2012. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

Trench 106 helps contain the polymer so that it does not spread over a larger region.

Polymer material(s) added to trench 106 can be used for optical enhancements, such as a lens 841. The lens characteristics can be tailored using the 3D printing technique where location, volume, viscosity and other characteristics can be tailored. For example, the lens curvature and lens direction can be controlled. In this example, lens 841 has a rounded surface that is convex and protrudes away from trench 106. In another example, the lens may have a greater or less degree of convex curvature. In another example, the lens may be concave, or another shape that has useful optical properties for a target wavelength of incident light.

In this example, multilayer ARC 108 is illustrated. In another example, an ARC with more or fewer layers may be used based on the intended application and incident light wavelength.

While a single trench 106 is illustrated in FIG. 8, IC 800 may contain multiple trenches for multiple light sensors. Different color polymer material may be added to the different respective trenches allow each light sensor to respond to a different color/wavelength of incident light. Different lens shapes may be provided to different trenches to alter the amount of incident light collected by each light sensor.

In another example, ARC may be optimized to serve as a PO layer for Si protection and possibly for IR rejection.

In described examples, the ARC material/thickness/layers may be selected to optimize for a particular incident light wavelength. In another example, the ARC material/thickness/layers may be selected to produce IR rejection.

In another example, the ARC material/thickness/layers may be selected to be responsive to a narrow range of IR wavelength for intended applications such as LIDAR (light detection and ranging), a remote sensing method that uses light in the form of a pulsed laser to measure ranges.

If the wafer is thicker than the sensor and the trench opening is much larger than the sensor (ideally with tapered profile focusing on the sensor) the optical lens can ideally significantly increase the light intensity in the sensor compared to not having a lens. Both the trench and the polymer can be used either separately or together to concentrate light.

Figure 9:
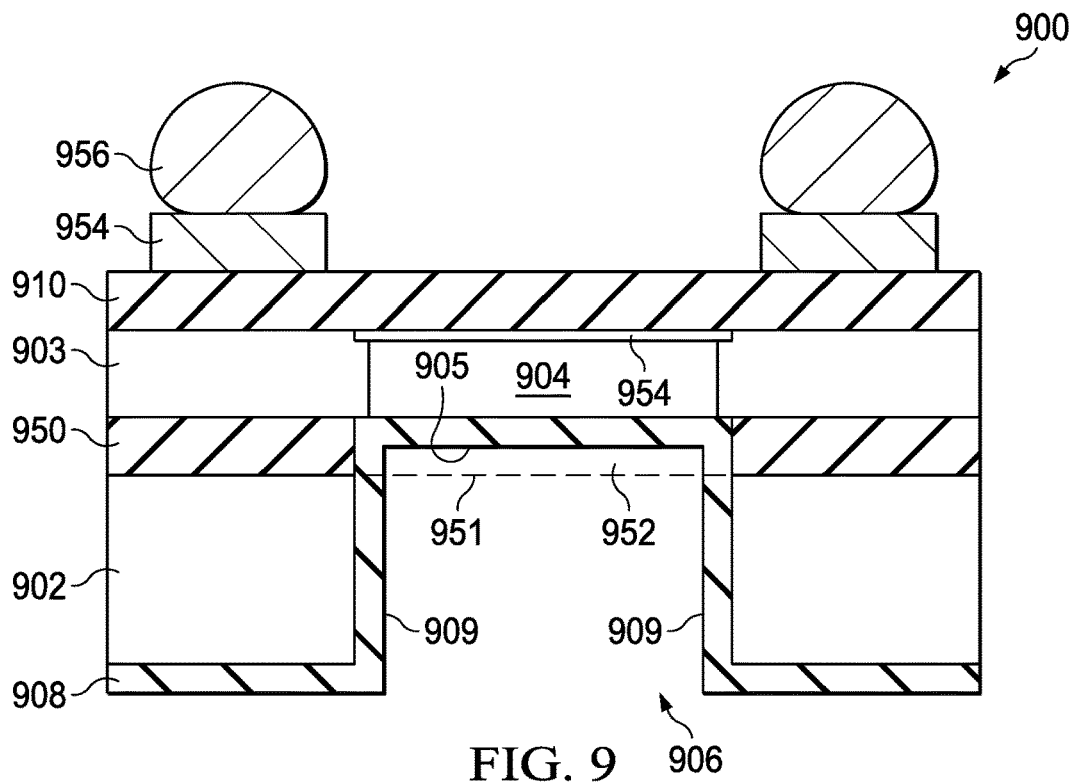
FIGS. 9-11 are cross-sectional views of portions of example ICs with backside incident light detection.

FIG. 9 is a cross-section view of a portion of another example IC 900 with backside incident light detection. In some applications there is a desire for light to enter from the backside of the sensor instead of the frontside where metal and interconnect is present. Without additional processing, the light would be absorbed by the silicon substrate and never reach the Si sensor. One reason to want light from the back is to allow wafer chip scale package (WCSP) bonds on the front of the wafer.

WCSP is getting more popular in portable electronics due to its better electrical parameters, smaller size, and lower manufacturing cost. A silicon chip can be packaged with many options. The QFN package fully encloses the silicon die in a plastic casing, making contacts to the printed circuit board (PCB) through bond wires and lead frame, while the WCSP package makes direct interconnection from the silicon chip to the PCB through solder balls. This reduces the footprint on the board to the minimum because the footprint is the same size as the die. It also minimizes the parasitic resistance, inductance, and the weight by getting rid of extra bond wires, lead frame, and encapsulation. There is minimum electrical distance between the circuitry on the silicon and PCB. The interconnection is direct and through a very wide channel, namely solder ball array. By eliminating the wire bonds as well as any substrate related impedance, WCSP provides excellent electrical performance. It helps to achieve a total solution with better efficiency, less expense, smaller footprint size, lower height, and lighter weight.

In the example portion of WCSP IC 900 of FIG. 9, solder bumps 956 are formed on the frontside on copper pads 954 that are in turn respectively coupled to interconnect lines in the conductive layers of dielectric stack 910 and thereby to various circuit components (not shown) within IC 900. Dielectric stack 910 includes multiple patterned conductive layers separated by dielectric layers and is like dielectric stack 110 of FIG. 1.

Example IC 900 is fabricated on a silicon on insulator (SOI) wafer using known or later developed SOI technology. In this example, a silicon layer 903 is fabricated over a layer 950 of silicon dioxide (SiO2) on substrate 902. Optical sensor region 904 is fabricated within silicon layer 903. Optical sensor region 904 is fabricated in a similar manner as sensor 104 of FIG. 1 in this example.

Trench 906 is etched from the backside of wafer 902 using a wet or dry etch technology and is stopped by SiO2 layer 950 as indicated at 951. A second timed etch may then be performed to remove a portion 952 of SiO2 layer 950 to move trench 906 close to or in contact with the backside of optical sensor 904.

In some examples, a reflector 954 is placed on the frontside of the wafer 902. This might be silicide, or MET1 (metal layer 1) or even a trench etched in the dielectric stopping on the silicon followed by ARC and metal, such as trench 106 of FIG. 1. An advantage of adding a reflector on the frontside of the wafer is that by reflecting light that travels through optic sensor 904 from the backside trench 906 the sensor 904 can receive a larger amount of light energy. If the silicide is used as the reflector or part of the reflector then this layer can be used to enhance the Si diode sensor.

A dielectric or polymer ARC/filter layer 908 is deposited on the backside surface of IC 900 and provides an ARC on the bottom 905 and sides 909 of trench 906 to control reflections within trench 906. ARC layer 908 is like ARC layer 108 as described in more detail referring to FIG. 1 or FIG. 3D-2.

A polymer filter can be formed in trench 906 to create optical element such as lens as described in more detail with reference to filter 840, lens 841 of FIG. 8.

Figure 10:
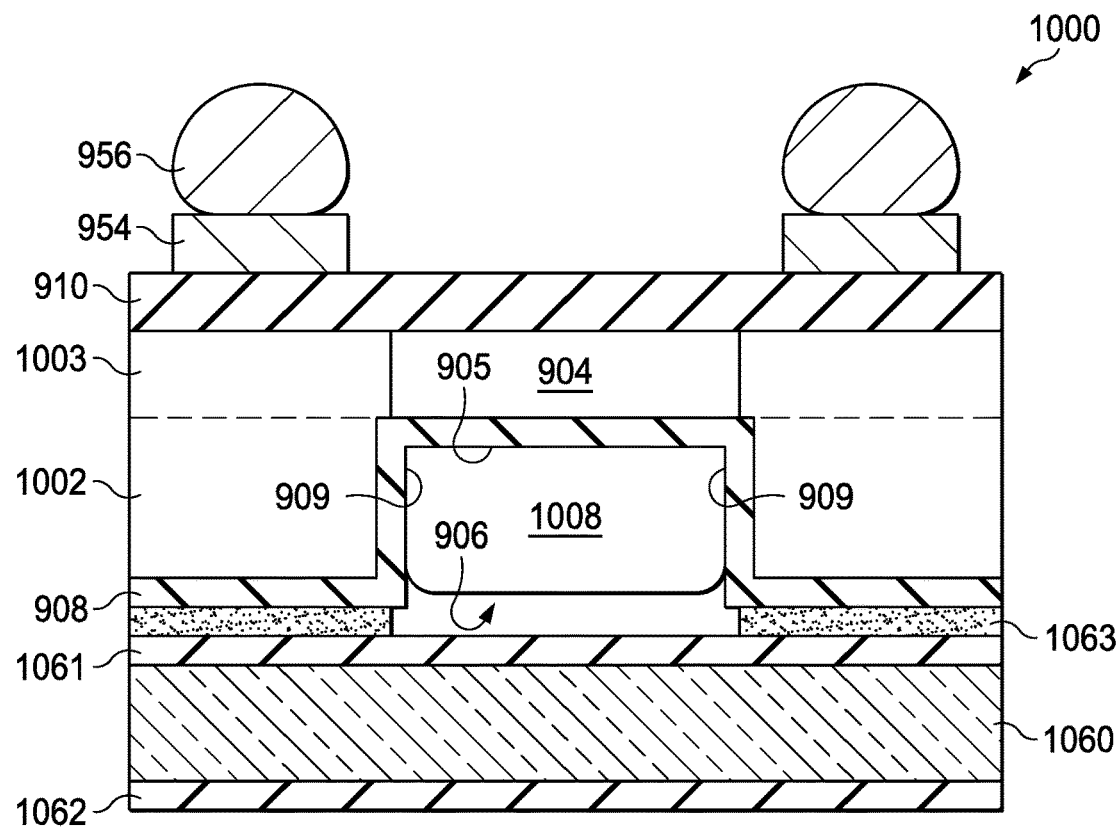

FIG. 10 is a cross-section view of a portion of another example IC 1000 WSCP optical sensor device with backside incident light detection. In this example, a backside trench 906 is formed using trench etch with a very thin Silicon wafer 1002. In this example, wafer 1002 is ground down to a thickness in a range of approximately 10 μm-50 μm. In this example, sensor 904 is built on wafer 1002 having an epitaxial silicon layer 1003. The sensor is built above the epitaxial Si. In this example, a bottom layer of the epitaxial wafer is made with a different doping characteristic (concentration, type, element) than the substrate 1002. A wet etch with the appropriate sensitivity or a combination dry etch and/or wet etch is used to etch the substrate 1002 stopping on epitaxial Si and therefore not damaging the sensor.

Thin wafer/device 1000 is mechanically supported using a glass wafer 1060 with optional ARC layers 1061, 1062 and optional optical filter 1008 in trench 906. Glass wafer 1060 is bonded to silicon wafer 1002 by known or later developed bond film 1063. Alternatively, optical filter material 1008 can be used to bond support wafer 1060 to sensor wafer 1002.

Figure 11:
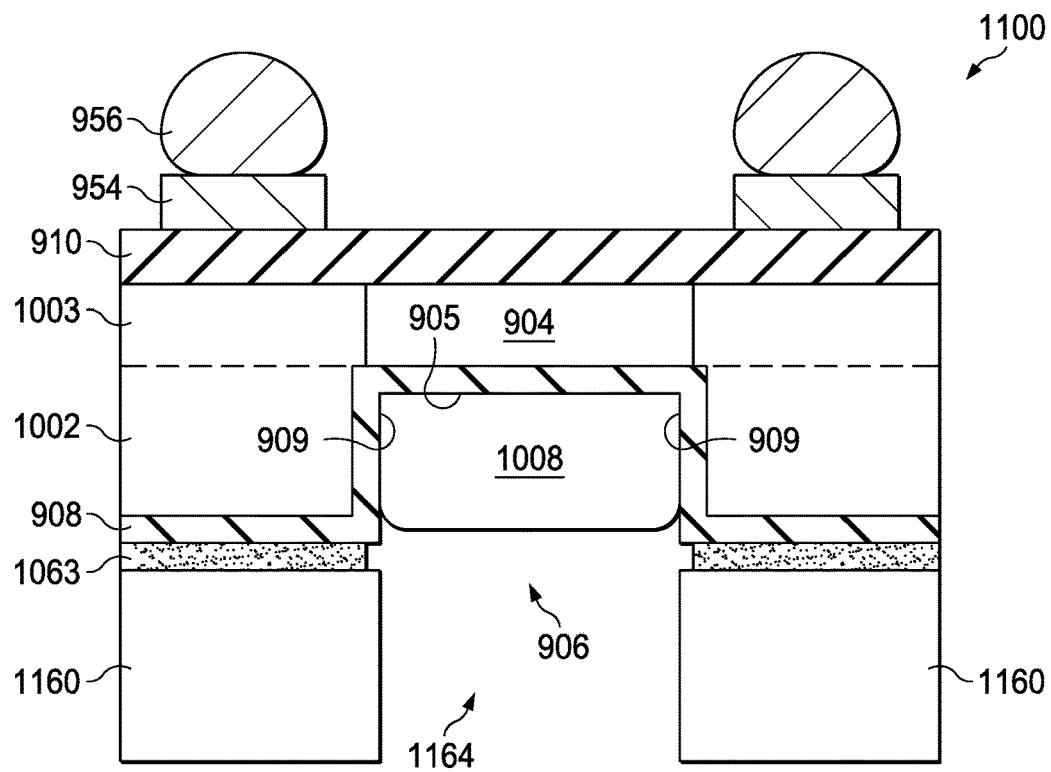

FIG. 11 is a cross-section view of a portion of another example IC 1100 WSCP optical sensor device with backside incident light detection that is fabricated in a similar manner as IC 1000 of FIG. 10. In this example, thin wafer 1002 is mechanically supported using a silicon wafer 1160 that has etched opening 1164 that aligns with trench 906 to allow backside light to enter trench 906 and travel to optical sensor 904. Silicon wafer 1160 is bonded to thin wafer 1002 by bond film 1063.

In this manner, various example optical sensors may be fabricated in which a trench is etched in the wafer either from the front side or from the backside to allow ambient light to fall on an optical sensor located within the wafer. An anti-reflection coating is deposited in the trench to enhance the optical signal into a silicon light sensor.

Figure 12:
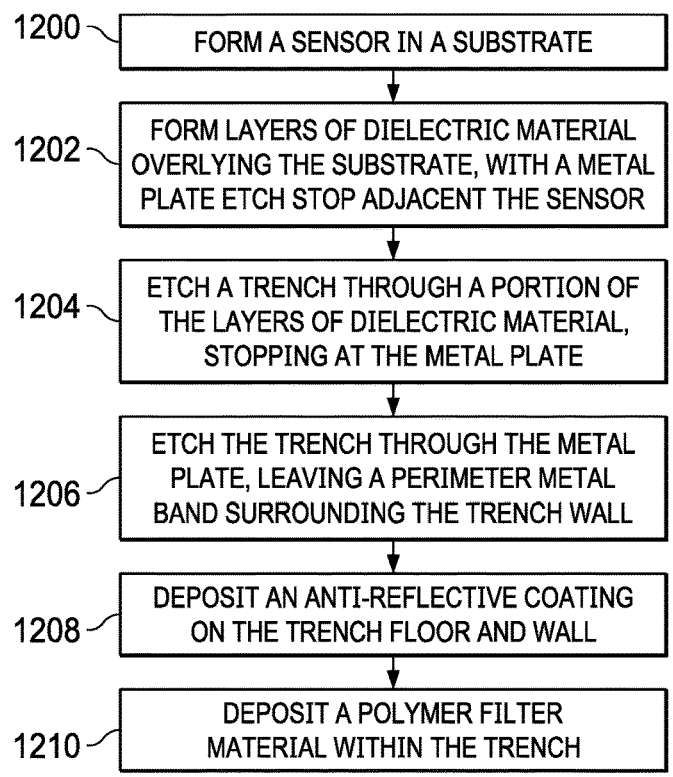
FIG. 12 is a flow chart illustrating formation of trench for exposing an optical sensor.

FIG. 12 is a flow chart illustrating formation of trench for exposing an optical sensor, such as trench 106 in FIG. 1, FIG. 3D-1, and FIG. 4.

At 1200, a sensor is formed in a silicon substrate using known or later developed techniques. The sensor may be an optical sensor such as photodiode 104 of FIG. 1.

At 1202, a passivation layer is formed on the surface of the substrate and covers the optical sensor. Layers of dielectric material alternating with patterned layers of metal are deposited over passivation layer, as described in more detail with reference to FIG. 3A. A metal plate etch stop is formed adjacent the sensor in a first layer of metal, such as metal plate 320 described in more detail in FIG. 3A.

At 1204, a trench is etched through a portion of the layers of dielectric and metal material. The etching process is stopped by the metal plate.

At 1206, a second etch is performed is performed through the metal plate that stops on the dielectric layer below the metal plate. The metal plate is intentionally larger than the extent of the trench so that a metal perimeter band remains surrounding the trench adjacent the trench wall. The metal perimeter band is embedded in the layers of dielectric material. A third etch is performed through the dielectric layer that stops on the passivation layer. A fourth timed etch is then performed to etch through passivation layer and only minimally etch the top surface of the sensor. In this manner, a smooth flat surface is formed on the top surface of the sensor and forms the smooth bottom for the trench.

At 1208, an anti-reflective coating is deposited over the surface of the substrate in a manner that it evenly coats the sides and bottom of the trench, as described in more detail with reference to FIG. 3D-1.

At 1210, in some examples the trench is filled with a polymer material that may be used for wavelength selection such as red, green, blue, violet, human light response, etc. by selecting an appropriate filter material, as described in more detail with regard to filter 840 of FIG. 8. In some examples, the polymer material may be formed with a convex surface protruding away from the trench to form a lens that can gather more light to enhance the sensitivity of the sensor as illustrated by lens 841 in FIG. 8.

OTHER EMBODIMENTS

In described examples, a single trench and optical sensor is illustrated. Other examples may include two or more sensors located in additional trenches.

In another example, the ARC may be two or more alternating layers of SiN and SiO2.

In other examples, the ARC layer(s) may be SiN, Si(x)N(y), SiNH(z), SiON, or other known or later discovered materials that have a low reflectivity and are compatible with IC fabrication.

In described example, an optical sensor is described. In other examples, the sensor, trench and antireflective coating may be designed for higher or lower frequencies, such as infrared or ultraviolet radiation.

In described examples, a CMOS IC is illustrated. In other examples, trenches fabricated as described hereinabove may be fabricated in other types of integrated circuits.

In described examples, a silicon substrate is used to fabricate the sensor. In other examples, other types of semiconductor substrates may be used with trenches formed therein and coated with an ARC.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An integrated circuit (IC) comprising:
    a substrate having a first surface and an opposite second surface;
    layers of dielectric material overlying at least a portion of the first surface;
    a trench through the layers of dielectric material, the trench extending to a trench floor at the first surface, and the trench surrounded by the layers of dielectric material that form a trench wall;
    a metal perimeter band in at least one of the layers of dielectric material, the metal perimeter band surrounding the trench adjacent the trench wall; and an optical sensor in the substrate at the first surface adjacent the trench.

2. The IC of claim 1, wherein the metal perimeter band is a portion of a metal plate etch stop separated from the substrate by only one of the layers of dielectric material.

3. The IC of claim 1, further comprising an anti-reflective coating on the trench floor and the trench wall.

4. The IC of claim 3, wherein the anti-reflective coating is a single layer of material.

5. The IC of claim 3, wherein the anti-reflective coating is a single layer of silicon nitride.

6. The IC of claim 1, wherein the metal perimeter band is a first metal perimeter band, and the IC further comprises a second metal perimeter band in a different one of the layers of dielectric material, the second metal perimeter band surrounding the trench adjacent the trench wall.

7. The IC of claim 1, further comprising a backside trench in the substrate, the backside trench extending from the second surface to a backside trench floor at the optical sensor, and the backside trench surrounded by the substrate that forms a backside trench wall.

8. The IC of claim 7, further comprising an anti-reflective coating on the backside trench floor and the backside trench wall.

9. The IC of claim 8, further comprising a support wafer bonded to the second surface.

10. An integrated circuit (IC) comprising:
a substrate having a first surface and an opposite second surface;
layers of dielectric material overlying at least a portion of the first surface;
a trench through the layers of dielectric material, the trench extending to a trench floor at the first surface, and the trench surrounded by the layers of dielectric material that form a trench wall;
a metal perimeter band in at least one of the layers of dielectric material, the metal perimeter band surrounding the trench adjacent the trench wall; and
a polymer filter material within the trench.

11. The IC of claim 10, wherein the polymer filter material has a convex surface protruding away from the trench.

12. An integrated circuit (IC) comprising:
a substrate having a first surface and an opposite second surface;
layers of dielectric material overlying at least a portion of the first surface;
a sensor in the substrate at the first surface;
a backside trench in the substrate, the backside trench extending from the second surface to a backside trench floor at the sensor, and the backside trench surrounded by the substrate that forms a backside trench wall; and
an anti-reflective coating on the backside trench floor and the backside trench wall.

13. The IC of claim 12, further comprising a reflector adjacent the sensor.

14. The IC of claim 12, further comprising a support wafer bonded to the second surface.

15. The IC of claim 14, further comprising an anti-reflective coating on the frontside trench floor and the frontside trench wall.

16. The IC of claim 12, further comprising:
a frontside trench through the layers of dielectric material, the frontside trench extending to a frontside trench floor at the sensor, and the frontside trench surrounded by the layers of dielectric material that form a frontside trench wall; and
a metal perimeter band in at least one of the layers of dielectric material, the metal perimeter band surrounding the frontside trench adjacent the frontside trench wall.

* * * * *